(12) United States Patent
Huang et al.

(10) Patent No.: US 12,713,919 B2
(45) Date of Patent: Aug. 18, 2026

(54) SEMICONDUCTOR PACKAGE STRUCTURE

(71) Applicant: Advanced Semiconductor Engineering, Inc., Kaohsiung (TW)

(72) Inventors: Hung-Hsien Huang, Kaohsiung (TW); Wen Chun Wu, Kaohsiung (TW); Chih-Pin Hung, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 690 days.

(21) Appl. No.: 17/993,797

(22) Filed: Nov. 23, 2022

(65) Prior Publication Data

US 2024/0170364 A1 May 23, 2024

(51) Int. Cl.
*H10W 40/73* (2026.01)
*H10W 40/20* (2026.01)
(Continued)

(52) U.S. Cl.
CPC ........... *H10W 40/73* (2026.01); *H10W 40/40* (2026.01); *H10W 40/235* (2026.01); *H10W 40/258* (2026.01); *H10W 72/877* (2026.01); *H10W 74/111* (2026.01); *H10W 74/114* (2026.01); *H10W 76/15* (2026.01); *H10W 90/00* (2026.01);
(Continued)

(58) Field of Classification Search
CPC ......... H01L 23/46–4735; H01L 23/427–4338; H01L 23/053–057; H01L 23/041–051; H01L 23/3107; H01L 23/3121–315; H01L 25/042; H01L 25/0652; H01L 25/0644; H01L 25/072; H01L 25/0753; H01L 2023/4037; H01L 2023/4882; H01L 2023/4056; H01L 23/3736; H01L 24/16; H01L 24/73; H01L 2023/405; H01L 2224/16225; H01L 2224/32245;
(Continued)

(56) References Cited

U.S. PATENT DOCUMENTS 12,111,114 B2 * 10/2024 Huang ................ F28D 15/0283
2005/0083655 A1 4/2005 Jairazbhoy et al.
(Continued)

FOREIGN PATENT DOCUMENTS

WO WO-2020071137 A1 * 4/2020 ................ C09J 5/00
WO WO-2022205504 A1 * 10/2022 ........... H01L 23/473

OTHER PUBLICATIONS

Matweb reference for coefficient of thermal expansion of copper and thermal conductivity of copper and aluminum (Year: 1998).*
English translation of WO-2020071137-A1 (Year: 2020).*
Matweb reference for CTE of Epoxy (Year: 1998).*
English translation of Lei (WO-2022205504-A1) (Year: 2022).*

*Primary Examiner* — Zandra V Smith
*Assistant Examiner* — Douglas Yap
(74) *Attorney, Agent, or Firm* — Foley and Lardner LLP

(57) ABSTRACT

A semiconductor device package and a method of manufacturing a semiconductor device package are provided. The semiconductor device package includes at least one electronic component, a heat source, and a heat dissipation element. The heat source is adjacent to the electronic component. The heat dissipation element is disposed adjacent to the heat source and the electronic component. The heat dissipation element includes a heat transmitting structure configured to reduce heat, which is from the heat source, through the heat dissipation element, and transmitting in a direction toward the electronic component.

20 Claims, 12 Drawing Sheets

(51) Int. Cl.
*H10W 40/25* (2026.01)
*H10W 40/40* (2026.01)
*H10W 72/00* (2026.01)
*H10W 74/10* (2026.01)
*H10W 76/15* (2026.01)
*H10W 90/00* (2026.01)

(52) U.S. Cl.
CPC ........ *H10W 90/724* (2026.01); *H10W 90/736* (2026.01)

(58) Field of Classification Search
CPC .. H01L 2224/73253; H10W 40/40–47; H10W 40/73; H10W 40/735
See application file for complete search history.

(56) References Cited

U.S. PATENT DOCUMENTS

2014/0264957 A1* 9/2014 Lowe, Jr. .............. H01L 23/544 427/515
2016/0225693 A1* 8/2016 Tolentino ............ H01L 25/0652
2020/0075542 A1* 3/2020 Sung ........................ H01L 24/16
2021/0262737 A1* 8/2021 North .................... F28D 15/046
2022/0243992 A1* 8/2022 Huang ................ F28D 15/0233
2023/0057025 A1* 2/2023 Lin ..................... H01L 23/3736
2023/0154828 A1* 5/2023 Haba ..................... H01L 23/473 257/714

* cited by examiner 300
310P
310C

X
Z
300
310P
311
310C

X
Z 30
310
310P
311

X
Z
30
10
210
22
21
310
310P
311

X
Z

SEMICONDUCTOR PACKAGE STRUCTURE

BACKGROUND

1. Technical Field

The present disclosure relates generally to a semiconductor package structure.

2. Description of the Related Art

Multiple components with various functions may be integrated within one package. However, some of the components may be capable of withstanding a relatively high temperature while others may be damaged by said relatively high temperature. Therefore, heat dissipation is an important issue in such heterogeneous integrated package structure.

SUMMARY

In one or more embodiments, a semiconductor package structure includes at least one electronic component, a heat source, and a heat dissipation element. The heat source is adjacent to the electronic component. The heat dissipation element is disposed adjacent to the heat source and the electronic component. The heat dissipation element includes a heat transmitting structure configured to reduce heat, which is from the heat source, through the heat dissipation element, and transmitting in a direction toward the electronic component.

In one or more embodiments, a semiconductor package structure includes a heat source and a heat dissipation element. The heat dissipation element is attached to the heat source, wherein the heat dissipation element includes a heat transmitting portion and a heat dissipating portion, and the heat transmitting portion is configured to reduce a first expansion of the heat dissipating portion caused by the heat dissipating portion absorbing heat generated by the heat source.

In one or more embodiments, a semiconductor package structure includes a first electronic component, a heat source, and a heat dissipation element. The heat source is arranged adjacent to the first electronic component. The heat dissipation element is disposed over the first electronic component and the heat source, wherein the heat dissipation element includes a heat transmitting structure over the heat source, and the heat transmitting structure is at least partially over the first electronic component.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
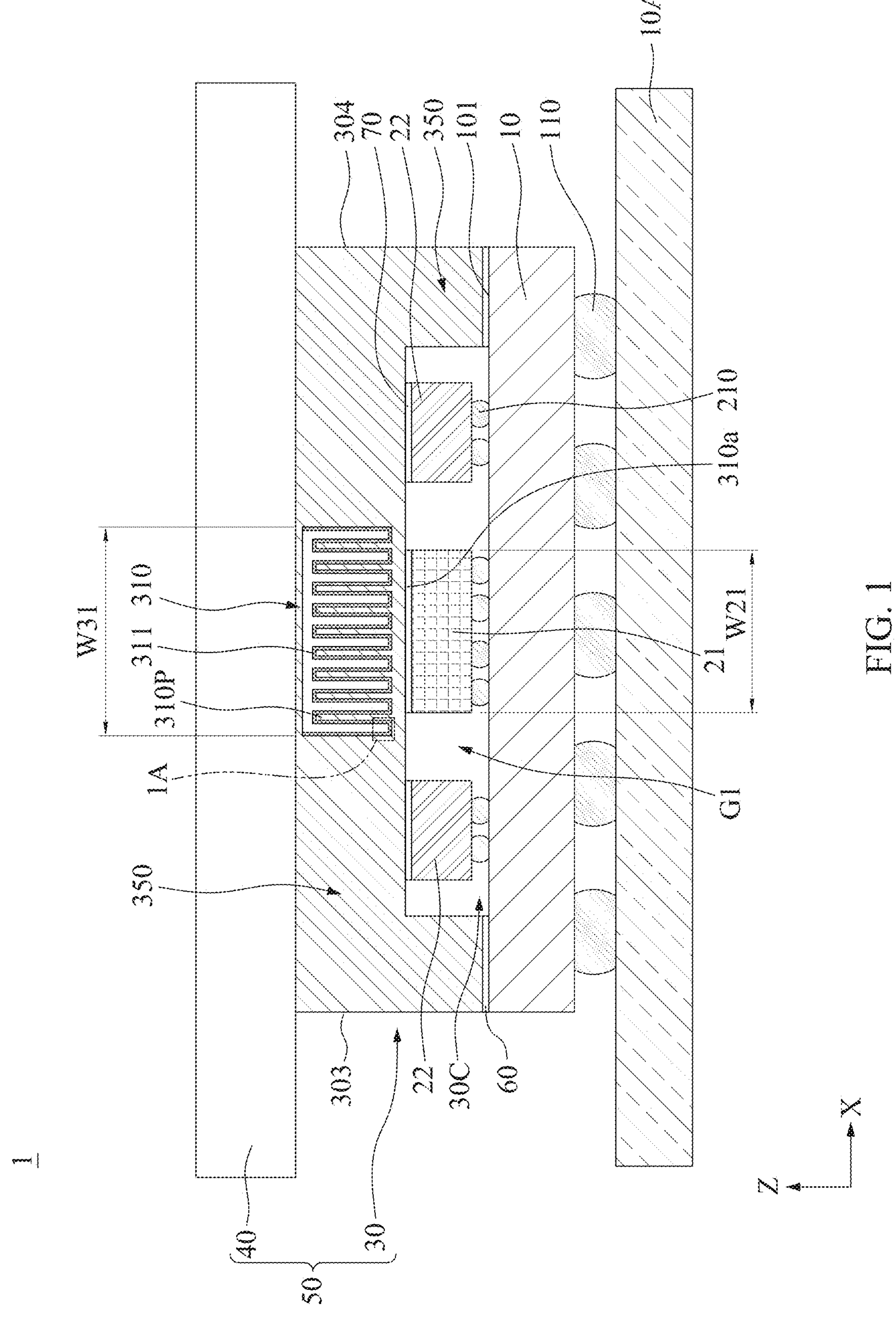
FIG. 1 is a cross-section of a semiconductor device package in accordance with some embodiments of the present disclosure.

FIG. 1 is a cross-section of a semiconductor device package 1 in accordance with some embodiments of the present disclosure. The semiconductor device package 1 includes a carrier 10A, a substrate 10, electronic components 21 and 22, a heat dissipation structure 50, an adhesive layer 60, a thermal interface material (TIM) layer 70, and connection elements 110 and 210.

The carrier 10A may include, for example, a printed circuit board, such as a paper-based copper foil laminate, a composite copper foil laminate, or a polymer-impregnated glass-fiber-based copper foil laminate. The carrier 10A may include an interconnection structure, such as a plurality of conductive traces and/or a plurality of conductive vias. The interconnection structure may include a redistribution layer (RDL) and/or a grounding element. In some embodiments, the carrier 10A includes a ceramic material or a metal plate. In some embodiments, the carrier 10A includes a substrate, such as an organic substrate or a leadframe. In some embodiments, the carrier 10A includes a two-layer substrate which includes a core layer and a conductive material and/or structure disposed on an upper surface and a bottom surface of the carrier 10A. The conductive material and/or structure may include a plurality of traces.

The substrate 10 may be disposed on or over the carrier 10A. The substrate 10 may include, for example, a printed circuit board, such as a paper-based copper foil laminate, a composite copper foil laminate, or a polymer-impregnated glass-fiber-based copper foil laminate. The substrate 10 may include an interconnection structure, such as a plurality of conductive traces and/or a plurality of conductive vias. The interconnection structure may include an RDL and/or a grounding element. In some embodiments, the substrate 10 is or includes an interposer. The interposer may include, for example but is not limited to, silicon (Si), glass, or other suitable material. In some embodiments, the substrate 10 is electrically connected to the carrier 10A through, e.g., connection elements 110. The connection elements 110 may be or include electrical contacts, such as solder balls, conductive bumps, or the like.

The electronic components 21 and 22 may be disposed on or over the carrier 10A. In some embodiments, the electronic components 21 and 22 are arranged side-by-side. In some embodiments, the electronic components 21 and 22 are disposed on or over the substrate 10. In some embodiments, the electronic components 21 and 22 are electrically connected to the substrate 10 through, e.g., connection elements 210. The connection elements 210 may be or include electrical contacts, such as solder balls, conductive bumps, or the like. In some embodiments, the electronic component 22 is adjacent to the electronic component 21. In some embodiments, the electronic component 22 is adjacent to the electronic component 21 and separated from the electronic component 21 by a gap G1. In some embodiments, a heating power of the electronic component 21 is greater than a heating power of the electronic component 22. The heating power may be referred to heat or heating power generated or resulted from a working temperature or an operational temperature of the electronic component. In some embodiments, the heating power of the electronic component 21 is from about 300 W to about 400 W, e.g., about 360 W, and the heating power of the electronic component 22 is from about 2 W to about 10 W, e.g., about 5 W. In some embodiments, the electronic component 21 is or includes a processing component, e.g., a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuit. In some embodiments, the electronic component 22 is or includes a passive component (e.g., a capacitor, a resistor, an inductor, a diode, a fuse, an antifuse, etc.), a memory component (e.g., a high bandwidth memory (HBM)), or other components generating less heating power than that of the electronic component 21. In some embodiments, the electronic component 21 is or includes a heat-source device, and the electronic component 22 is or includes a heat-sensitive device. In some embodiments, the electronic component 21 may be referred to as a heat source of the semiconductor package structure.

The heat dissipation structure 50 may be disposed on or over the carrier 10A. In some embodiments, the heat dissipation structure 50 is disposed on or over the substrate 10. In some embodiments, the heat dissipation structure 50 is disposed over the electronic components 21 and 22. In some embodiments, the electronic components 21 and 22 are disposed in an accommodating space 30C define by the heat dissipation structure 50.

In some embodiments, the heat dissipation structure 50 includes a heat dissipation element 30 and a heat sink 40. In some embodiments, the heat dissipation structure 50 (or the heat dissipation element 30) includes at least an anisotropic heat conducting zone 310 (also referred to as “a heat transmitting structure” or “a heat transmitting portion”) and an isotropic heat conducting zone 350 (also referred to as “a heat dissipating structure” or “a heat dissipating portion”).

In some embodiments, the heat dissipation element 30 is or includes a lid, such as a copper lid, and the accommodating space 30C is defined by the copper lid. In some embodiments, the heat dissipation element 30 is attached to the heat source (or the electronic component 21). In some embodiments, the heat dissipation element 30 is disposed adjacent to the heat source (or the electronic component 21) and the electronic component 22, the heat transmitting structure (or the anisotropic heat conducting zone 310) is configured to reduce heat, which is from the heat source (or the electronic component 21), through the heat dissipation element 30, and transmitting in a direction toward the electronic component 22.

In some embodiments, the anisotropic heat conducting zone 310 is at least partially over the electronic component 21. In some embodiments, the heat transmitting structure (or the anisotropic heat conducting zone 310) is located over the heat source (or the electronic component 21). In some embodiments, the anisotropic heat conducting zone 310 is free from overlapping the electronic component 22 from a top view perspective. In some embodiments, the heat transmitting structure (or the anisotropic heat conducting zone 310) is located between the electronic component 22 and the heat source (or the electronic component 21) from a top view perspective. In some embodiments, the anisotropic heat conducting zone 310 is directly above the electronic component 21. In some embodiments, an upper surface of the electronic component 21 directly or physically contacts an outer wall **310*a* of the heat dissipation element 30. In some embodiments, the upper surface of the electronic component 22 directly or physically contacts a portion of the outer wall 310*a* of the heat dissipation element 30 corresponding to the anisotropic heat conducting zone 310. In some embodiments, a width W31 of the anisotropic heat conducting zone 310 is greater than a width W21 of the electronic component 21**.

In some embodiments, the anisotropic heat conducting zone 310 is configured to dissipate or conduct heat with a preferred direction or within a preferred region. In some embodiments, the anisotropic heat conducting zone 310 is configured to enhance heat conduction within the anisotropic heat conducting zone 310. In some embodiments, the heat conducting zone 310 is configured to dissipate heat in a direction (e.g., Z-axis) substantially perpendicular to an upper surface 101 (e.g., X-Y plane) of the substrate 10. In some embodiments, the heat transmitting structure (or the anisotropic heat conducting zone 310) is configured to transmit heat upwards (e.g., Z-axis) faster than in lateral directions. In some embodiments, the heat transmitting structure (or the anisotropic heat conducting zone 310) is configured to transmit heat upwards faster than in the direction (e.g., X-axis and/or Y-axis) toward the electronic component 22. In some embodiments, the heat transmitting portion (or the anisotropic heat conducting zone 310) is configured to reduce an expansion of the heat dissipating portion (or the isotropic heat conducting zone 350) caused by the heat dissipating portion (or the isotropic heat conducting zone 350) absorbing heat generated by the heat source (or the electronic component 21).

In some embodiments, the anisotropic heat conducting zone 310 includes a chamber (or a vapor chamber). The anisotropic heat conducting zone 310 may further include a plurality of protrusions 310P protruding toward inside the vapor chamber. The protrusions 310P may be pillars, plates, walls, etc. The protrusions 310P may divide the vapor chamber into a plurality of sub-chambers connected to each other. The vapor chamber may include a wick structure 311

(also referred to as "a capillary wick") on an inner surface of the vapor chamber. The wick structure 311 may be conformally formed on surfaces of the protrusions 310P. In some embodiments, the wick structure 311 is on an inner sidewall and a bottom of the vapor chamber. In some embodiments, the wick structure 311 is on sidewalls of the protrusions 310P. In some embodiments, the heat transmitting structure (or the anisotropic heat conducting zone 310) includes a chamber and a working fluid within the chamber, and the working fluid is configured to undergo gas-liquid phase changes within the chamber. In some embodiments, the anisotropic heat conducting zone 310 is a vapor chamber including a working liquid (or a working fluid) capable of entering a phase transition around a working temperature of the electronic component 21. The working fluid is sealed within the chamber of the anisotropic heat conducting zone 310. The material of the working fluid is selected based on the temperature at which the heat transmission element 30 may operate (e.g., the operating temperature). For example, the working fluid is selected from the materials that can undergo gas-liquid phase changes within the chamber so that the chamber includes both vapor and liquid within the operating temperature range. In some embodiments, the working fluid may include, for example, water or an organic solution, such as ammonia, alcohol (e.g., ethanol) or any other suitable materials. The working liquid (or the working fluid) may include water or a solvent having a melting point lower than that of water (e.g., alcohol or the like). In some embodiments, at least a portion of the working fluid absorbs heat and is vaporized into gas or vapor. The vaporized working fluid flows within the chamber of the anisotropic heat conducting zone 310 from a position at a higher temperature to a position at a lower temperature where the vaporized working fluid releases heat and is condensed into liquid. The condensed working fluid is then sucked by the wick structure 311 and flows within the wick structure 311 back to the position at a higher temperature to continue another thermal cycle.

In some embodiments, the wick structure 311 includes a metal-containing material. The wick structure 311 may be composed of a copper-containing material configured to facilitate capillary phenomenon. The bottom of the vapor chamber adjacent to the electronic component 21 may serve as a heat absorber, the upper inner wall of the vapor chamber may serve as a condenser that is spaced apart from the heat absorber, and the working liquid (or the working fluid) performs a liquid-vapor phase change between the bottom and the upper inner wall of the vapor chamber to conduct heat in a direction from the electronic component 21 to the heat sink 40.

In some embodiments, the isotropic heat conducting zone 350 is over the electronic component 22. In some embodiments, an upper surface of the electronic component 22 directly or physically contacts a portion of the outer wall 310*a* of the heat dissipation element 30 corresponding to the isotropic heat conducting zone 350. In some embodiments, the anisotropic heat conducting zone 310 has a greater coefficient of planar heat conduction ($k_{x-y}$) than that of the isotropic heat conducting zone 350, and configured to reduce heat conducting from the anisotropic heat conducting zone 310 toward the isotropic heat conducting zone 350. In some embodiments, the isotropic heat conducting zone 350 refers to all remaining part of the heat dissipation element 30 other than the anisotropic heat conducting zone(s). In some embodiments, the isotropic heat conducting zone 350 is composed of a continuous portion of the heat dissipation element 30 (e.g., a continuous copper portion of the copper lid). In some embodiments, the isotropic heat conducting zone 350 is configured to dissipate or conduct heat toward all directions. In some embodiments, heat in the isotropic heat conducting zone 350 has not preferred direction or zone for conduction. In some embodiments, the coefficient of planar heat conduction ($k_{x-y}$) of the anisotropic heat conducting zone 310 is from about 4500 W/mK to about 5500 W/mK, e.g., about 5000 W/mK, and the coefficient of planar heat conduction ($k_{x-y}$) of the isotropic heat conducting zone 350 is from about 300 W/mK to about 450 W/mK, e.g., about 380 W/mK. In some embodiments, the heat dissipating portion (or the isotropic heat conducting zone 350) has a heat transmitting rate less than a heat transmitting rate of the heat transmitting portion (or the anisotropic heat conducting zone 310). For example, a thermal conductivity of the heat dissipating portion (or the isotropic heat conducting zone 350) may be less than a thermal conductivity of the heat transmitting portion (or the anisotropic heat conducting zone 310), such that the heat transmitting portion (or the anisotropic heat conducting zone 310) transmit heat faster than the heat dissipating portion (or the isotropic heat conducting zone 350).

In some embodiments, the heat sink 40 is in direct or physical contact with the anisotropic heat conducting zone 310. In some embodiments, the heat sink 40 is further in direct or physical contact with the isotropic heat conducting zone 350. In some embodiments, a temperature of the heat sink 40 is lower than a condensation temperature of the working liquid (or the working fluid) of the anisotropic heat conducting zone 310 of the heat dissipation structure 50. In some embodiments, the temperature of the heat sink 40 is from about 50° C. to about 70° C., e.g., about 65° C. In some embodiments, the heat sink 40 includes a fan unit, a water cooler, a cooling plate, or a combination thereof.

In some embodiments, the heat dissipation element 30 is attached to the substrate 10 through the adhesive layer. In some embodiments, the heat transmitting portion (or the anisotropic heat conducting zone 310) is configured to reduce spacing between the adhesive layer 60 and the substrate 10. The description "spacing between the adhesive layer 60 and the substrate 10" refers to the situation where the adhesive layer 60 is gradually moving away from the substrate 10. That is, in some embodiments, the anisotropic heat conducting zone 310 is configured to reduce the situation of the adhesive layer 60 being gradually moving away from the substrate 10.

In some embodiments, the TIM layer 70 is between the electronic component 22 and the heat dissipating portion (or the isotropic heat conducting zone 350). In some embodiments, the heat transmitting portion (or the anisotropic heat conducting zone 310) is outside of the TIM layer 70 from a top view perspective. In some embodiments, the heat transmitting portion (or the anisotropic heat conducting zone 310) is configured to reduce a bleeding of the TIM layer 70 toward outside of a gap between the electronic component 22 and the heat dissipating portion (or the isotropic heat conducting zone 350).

In some cases where a homogenous or isotropic heat conducting plate is disposed on a heat-source device and a heat-sensitive device adjacent to the heat-source device for heat dissipation, the heat generated by the heat-source device may be transferred or conducted to the heat-sensitive device through the heat conducting plate. Hence, despite that heat generated by the heat-source device can be dissipated through the heat conducting plate, the heat-sensitive device can be damaged by the heat conducted from the heat-source device. In other words, the homogenous or isotropic heat conducting plate without an anisotropic heat conducting zone lacks control to the heat conduction, and thus the heat-sensitive device can be damaged by the heat conducted from the heat-source device.

In contrast, according to some embodiments of the present disclosure, with the design of the anisotropic heat conducting zone (e.g., the anisotropic heat conducting zone 310) of the heat dissipation structure 50 (or the heat dissipation element 30), heat conduction within the anisotropic heat conducting zone can be enhanced, such that the heat can be transferred or conducted with a preferred direction (e.g., the direction from the electronic component 21 toward the heat sink 40) or within a preferred region (e.g., the region defined by the anisotropic heat conducting zone). Therefore, heat can be dissipated relatively fast through the heat sink 40 which in contact with the anisotropic heat conducting zone, so that less heat generated under the anisotropic heat conducting zone is laterally conducted (in X-axis and/or Y-axis) crossing toward the isotropic heat conducting zone. Accordingly, control over heat conduction within the semiconductor device package 1 can be improved, and thus heat-sensitive devices (e.g., the electronic component 22) can be placed closely to heat-source devices (e.g., the electronic component 21) and prevented from being damaged by heat generated by the heat-source devices.

In addition, according to some embodiments of the present disclosure, the anisotropic heat conducting zone is directly over the electronic component 21 (i.e., the heat-source device) and free from overlapping the electronic component 22 (i.e., the heat-sensitive device), such that the heat transferred from the electronic component 21 can be confined within a region above the electronic component 21 and prevented from being conducted toward the electronic component 22. Therefore, heat of the semiconductor device package 1 can be dissipated through the confined region above the electronic component 21 to the heat sink 40, and the electronic component 22 can be well protected from being damaged by heat. For example, compared to adopting a homogenous or isotropic heat conducting plate for heat dissipation during operation of the semiconductor device package 1, the maximum temperature of the electronic component 21 (i.e., the heat-source device) can be lowered by about 16% (e.g., from about 150° C. to about 127° C.), and the maximum temperature of the electronic component 22 (i.e., the heat-sensitive device) can be lowered by about 12% (e.g., from about 99° C. to about 87° C.).

Moreover, according to some embodiments of the present disclosure, the anisotropic heat conducting zone includes a plurality of protrusions protruding toward inside a vapor chamber and a wick structure on surfaces of the vapor chamber and the protrusions, the protrusions can serve to support a cover above and enclosing the vapor chamber, so as to increase the structural strength and reliability of the anisotropic heat conducting zone of the heat dissipation structure. Furthermore, the wick structure formed on the surfaces of the protrusions can be provided with an increased heat dissipating surface area, so as to facilitate capillary phenomenon, such that heat dissipation effects of the semiconductor device package 1 can be further improved.

Figure 1A:
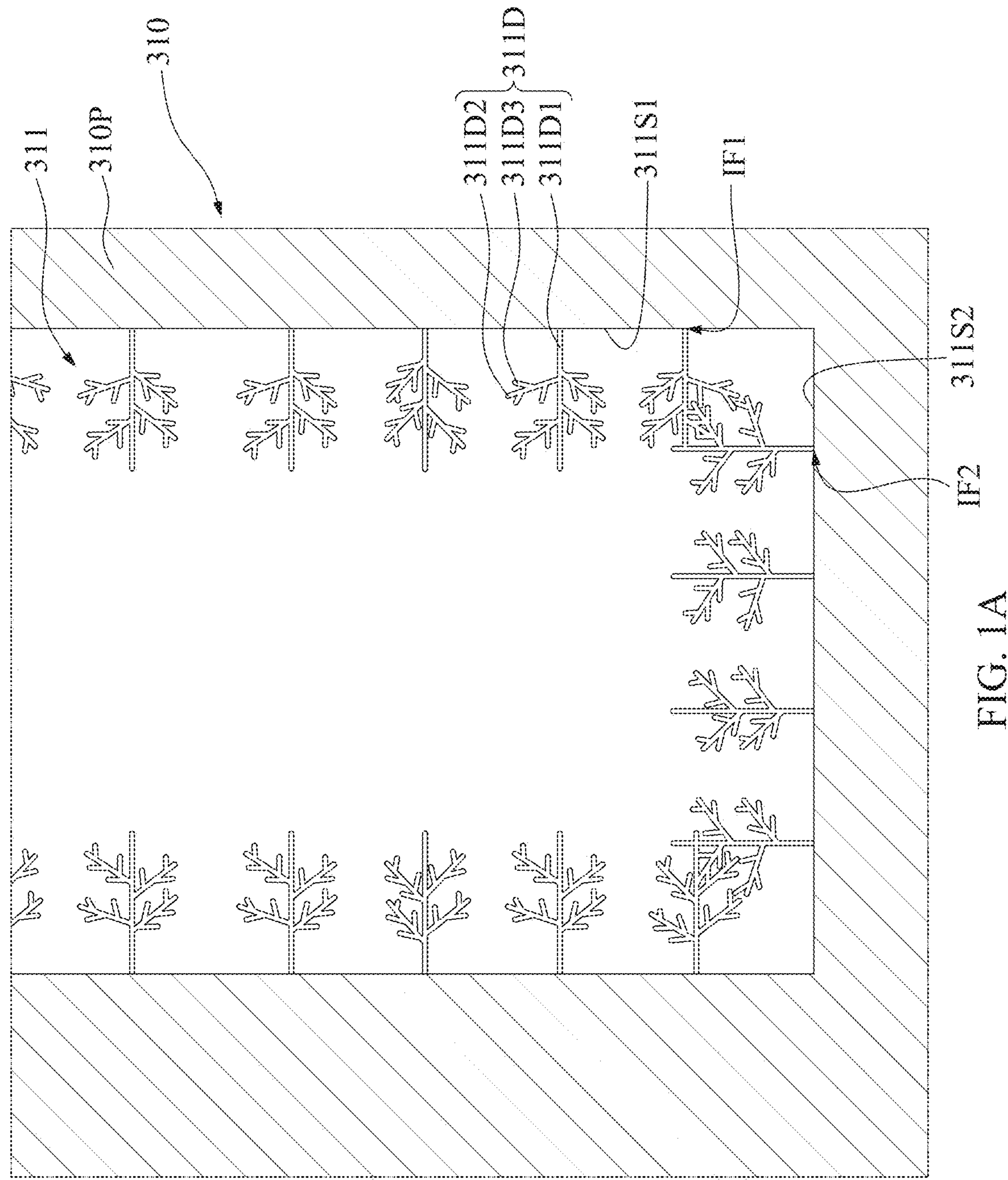
FIG. 1A is a cross-section of a portion of a semiconductor device package in accordance with some embodiments of the present disclosure.

FIG. 1A is a cross-section of a portion 1A of a semiconductor device package in accordance with some embodiments of the present disclosure.

In some embodiments, the heat transmitting structure (or the anisotropic heat conducting zone 310) includes a chamber and a plurality of protrusions 310P protruded from an inner side surface of the chamber. In some embodiments, the heat transmitting structure (or the anisotropic heat conducting zone 310) further includes a wick structure 311 on surfaces of the protrusions 310P. In some embodiments, the wick structure 311 includes one or more dendritic structures 311D. In some embodiments, the dendritic structure 311D includes a plurality of first branches 311D2 and a plurality of second branches 311D3 extending toward at least two different directions. Interfaces IF1 and IF2 exist between the one or more dendritic structures 311D and inner surfaces 311S1 and bottom surfaces 311S2 of the plurality of protrusions 310P. In some embodiments, ends of at least two branches of the dendritic structure 311D are in contact. The dendritic structure 311D may include a main branch or trunk (i.e., primary dendrite arm) 311D1 and the first branches 311D2 (i.e., side branches or secondary dendrite arms) grown from the trunk 31. In some embodiments, the second branches 311D3 (i.e., side branches or tertiary dendrite arms) are grown from the first branches 311D2, and so on. Intra-dendritic pores may be located within a dendritic structure 311D and defined by the trunk 311D1 and the first branches 311D2 of the dendritic structure 311D. Inter-dendritic pores may be located between or among two or more dendritic structures 311D. In some embodiments, the inter-dendritic pores may have a size greater than the intra-dendritic pores, and the dendritic layer 311D may be referred to as a dual-sized porous structure. The intra-dendritic pores enhance capillary force within the wick structure 311 so that the condensed working fluid can be sucked by the wick structure 311 and flow within the wick structure 311 from a position at a lower temperature towards a position at a higher temperature. The inter-dendritic pores provide fluid channels with a reduced flow resistance and thus are effective to accelerate the flow of the condensed working fluid. It has been found that the heat transmitting element 30 according to the present disclosure has a comparable or even superior heat transmission efficiency (or heat dissipation efficiency) to the existing techniques.

Figure 1B:
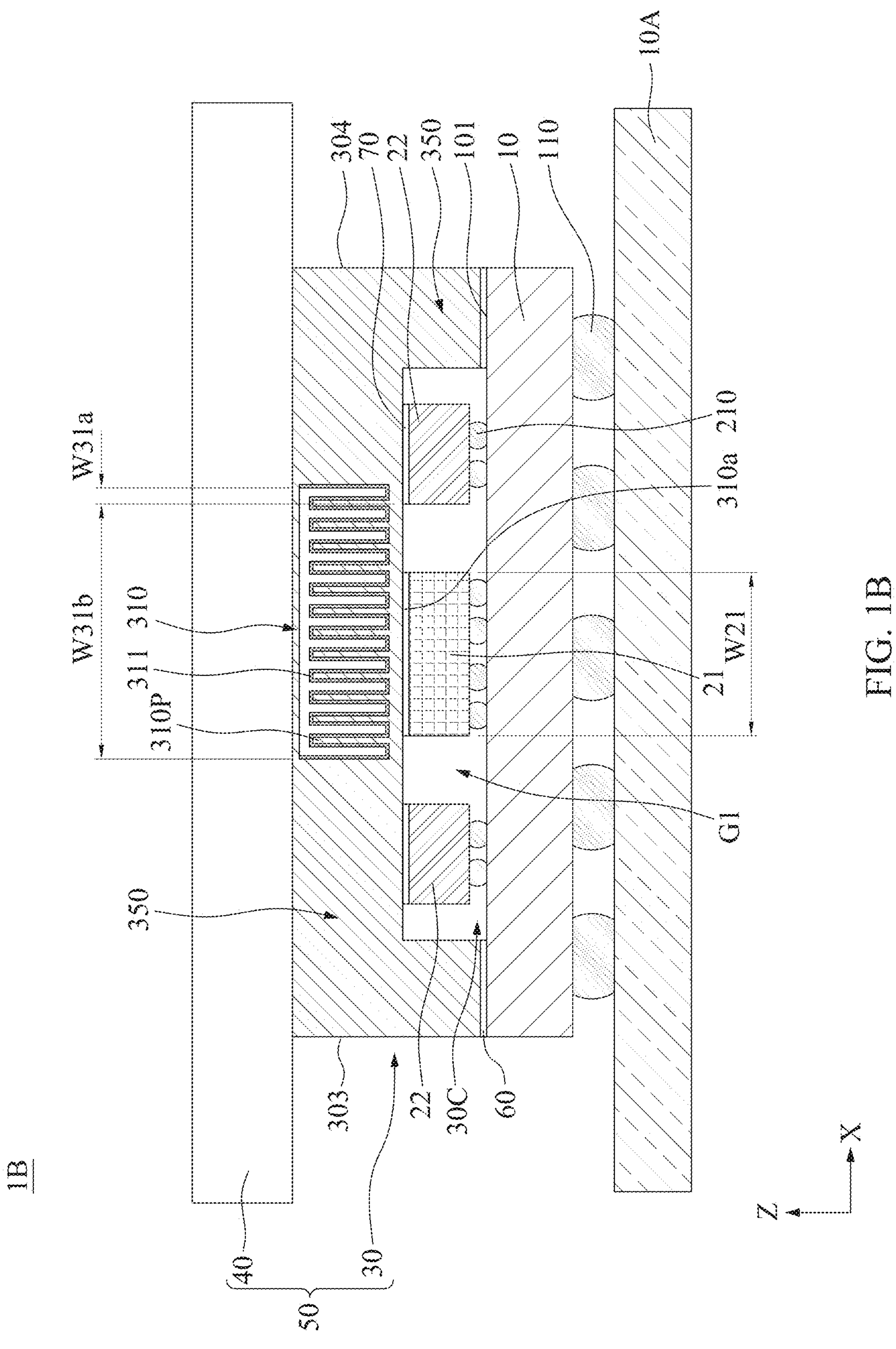
FIG. 1B is a cross-section of a semiconductor device package in accordance with some embodiments of the present disclosure.

FIG. 1B is a cross-section of a semiconductor device package 1B in accordance with some embodiments of the present disclosure. The semiconductor device package 1B is similar to the semiconductor device package 1 in FIG. 1, with differences therebetween as follows.

In some embodiments, the heat dissipation element 30 is disposed over the electronic component 22 and the heat source (or the electronic component 21). In some embodiments, the heat transmitting structure (or the anisotropic heat conducting zone 310) is over the heat source (or the electronic component 21), and the heat transmitting structure (or the anisotropic heat conducting zone 310) is at least partially over the electronic component 22. In some embodiments, the heat transmitting structure (or the anisotropic heat conducting zone 310) partially overlaps the electronic component 22. In some embodiments, the heat transmitting structure (or the anisotropic heat conducting zone 310) includes a first portion over the electronic component 22 and a second portion not over the electronic component 22 from a cross-sectional view, and a width W31*b* of the second portion is greater than a width W31*a* of the first portion.

Figure 2A:
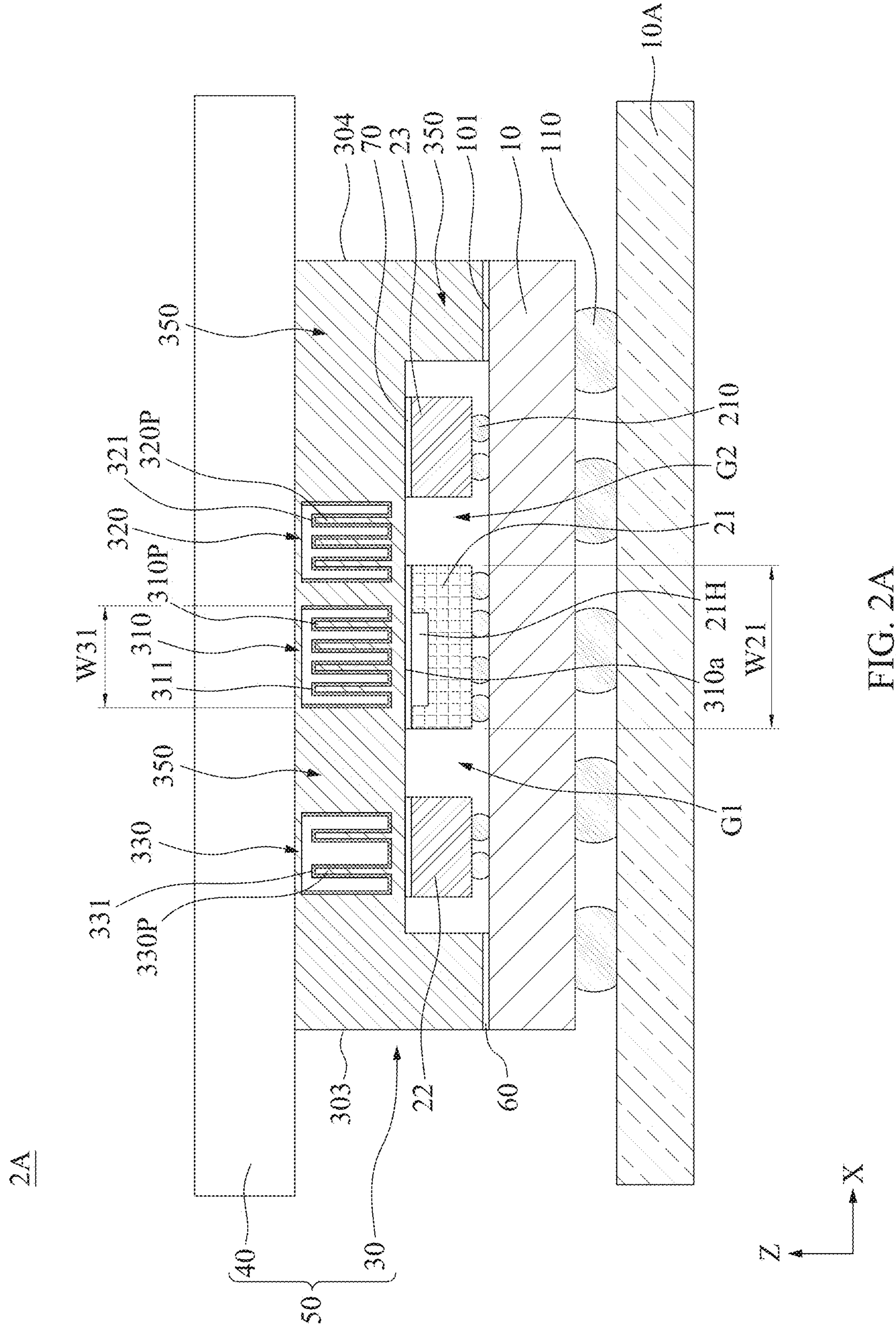
FIG. 2A is a cross-section of a semiconductor device package in accordance with some embodiments of the present disclosure.

FIG. 2A is a cross-section of a semiconductor device package 2A in accordance with some embodiments of the present disclosure. The semiconductor device package 2A is similar to the semiconductor device package 1 in FIG. 1, with differences therebetween as follows.

In some embodiments, the semiconductor device package 2A includes electronic components 21, 22, and 23. In some embodiments, the electronic components 22 and 23 are adjacent to the electronic component 21. In some embodiments, the electronic component 22 is adjacent to and separated from the electronic component 21 by a gap G1, and the electronic component 23 is adjacent to and separated from the electronic component 21 by a gap G2. In some embodiments, a heating power of the electronic component 21 is greater than a heating power of the electronic component 22, and the heating power of the electronic component 22 is greater than a heating power of the electronic component 23. In some embodiments, the electronic component 21 includes a heat source region 21H. In some embodiments, the electronic component 21 is or includes a heat-source device, and the electronic components 22 and 23 are or include heat-sensitive devices.

In some embodiments, the heat dissipation structure 50 (or the heat dissipation element 30) includes anisotropic heat conducting zones 310, 320, and 330 and an isotropic heat conducting zone 350.

In some embodiments, the anisotropic heat conducting zone 310 is partially or entirely over the electronic component 21 from a top view perspective. In some embodiments, the anisotropic heat conducting zone 310 is directly above the heat source region 21H. In some embodiments, an upper surface of the heat source region 21H directly or physically contacts a portion of the outer wall 310*a* of the heat dissipation element 30 corresponding to the anisotropic heat conducting zone 310. In some embodiments, a width W31 of the anisotropic heat conducting zone 310 is less than a width W21 of the electronic component 21. In some embodiments, the anisotropic heat conducting zone 310 has a greater coefficient of planar heat conduction ($k_{x-y}$) than that of the isotropic heat conducting zone 350, and configured to reduce heat conducting from the anisotropic heat conducting zone 310 toward the isotropic heat conducting zone 350. In some embodiments, the anisotropic heat conducting zone 310 has a greater coefficient of planar heat conduction ($k_{x-y}$) than that of at least one of the anisotropic heat conducting zones 320 and 330, and configured to reduce heat conducting from the anisotropic heat conducting zone 310 toward the anisotropic heat conducting zones 320 and/or 330.

In some embodiments, the anisotropic heat conducting zone 320 is at least partially over the gap G2. In some embodiments, the anisotropic heat conducting zone 320 is free from overlapping the electronic component 23 from a top view perspective. In some embodiments, the anisotropic heat conducting zone 320 is partially overlapping the electronic component 21 from a top view perspective. In some embodiments, the anisotropic heat conducting zone 320 has a greater coefficient of planar heat conduction ($k_{x-y}$) than that of the isotropic heat conducting zone 350, and configured to reduce heat conducting from the anisotropic heat conducting zone 320 toward the isotropic heat conducting zone 350. In some embodiments, the anisotropic heat conducting zone 320 includes a vapor chamber and a wick structure 321 on an inner surface of the vapor chamber. The anisotropic heat conducting zone 320 may further include a plurality of protrusions 320P protruding toward inside the vapor chamber. The protrusions 320P may be pillars, plates, walls, etc. The protrusions 320P may divide the vapor chamber into a plurality of sub-chambers connected to each other. In some embodiments, the wick structure 321 is on an inner sidewall and a bottom of the vapor chamber. In some embodiments, the wick structure 321 is on sidewalls of the protrusions 320P. In some embodiments, the anisotropic heat conducting zone 320 is a vapor chamber including a working liquid (or a working fluid) capable of entering a phase transition around a working temperature of the electronic component 21. In some embodiments, the wick structure 321 includes a metal-containing material. The wick structure 321 may be composed of a copper-containing material configured to facilitate capillary phenomenon. In some embodiments, the coefficient of planar heat conduction ($k_{x-y}$) of the anisotropic heat conducting zone 320 is from about 4500 W/mK to about 5500 W/mK, e.g., about 5000 W/mK In some embodiments, the anisotropic heat conducting zone 330 is partially or entirely over the electronic component 22 from a top view perspective. In some embodiments, the anisotropic heat conducting zone 330 is directly above the electronic component 22. In some embodiments, an upper surface of the electronic component 22 directly or physically contacts a portion of the outer wall 310*a* of the heat dissipation element 30 corresponding to the anisotropic heat conducting zone 330. In some embodiments, the anisotropic heat conducting zone 330 has a greater coefficient of planar heat conduction ($k_{x-y}$) than that of the isotropic heat conducting zone 350, and configured to reduce heat conducting from the anisotropic heat conducting zone 330 toward the isotropic heat conducting zone 350. In some embodiments, the anisotropic heat conducting zone 330 may have a coefficient of planar heat conduction ($k_{x-y}$) equal to or less than that of the anisotropic heat conducting zones 310 and 320. In some embodiments, the anisotropic heat conducting zone 330 includes a vapor chamber and a wick structure 331 on an inner surface of the vapor chamber. The anisotropic heat conducting zone 330 may further include a plurality of protrusions 330P protruding toward inside the vapor chamber. The protrusions 330P may be pillars, plates, walls, etc. The protrusions 330P may divide the vapor chamber into a plurality of sub-chambers connected to each other. In some embodiments, the wick structure 331 is on an inner sidewall and a bottom of the vapor chamber. In some embodiments, the wick structure 331 is on sidewalls of the protrusions 330P. In some embodiments, the anisotropic heat conducting zone 330 is a vapor chamber including a working liquid (or a working fluid) capable of entering a phase transition around a working temperature of the electronic component 22. In some embodiments, the wick structure 331 includes a metal-containing material. The wick structure 331 may be composed of a copper-containing material configured to facilitate capillary phenomenon. In some embodiments, the coefficient of planar heat conduction ($k_{x-y}$) of the anisotropic heat conducting zone 330 is less than about 5000 W/mK.

In some embodiments, the isotropic heat conducting zone 350 is over the electronic component 23. In some embodiments, an upper surface of the electronic component 23 directly or physically contacts a portion of the outer wall 310*a* of the heat dissipation element 30 corresponding to the isotropic heat conducting zone 350.

In some cases where an air cavity is formed between two portions in a heat conducting plate to block heat conduction between the two portions of the heat conducting plate, such cavity can seriously damage the structural strength of the heat conducting plate and thus the entire package structure. In contrast, according to some embodiments of the present disclosure, instead of forming an air cavity, the anisotropic heat conducting zone 320 is formed in the heat dissipation structure and at least partially over a gap between a heat-source device (e.g., the electronic component 21) and a heat-sensitive device (e.g., the electronic component 23), such that heat generated from the electronic component 21 can be dissipated through the heat sink 40 and blocked from conducting toward the electronic component 23 through the heat dissipation structure, and the structural strength of the heat dissipation structure 50 (or the heat dissipation element 30) can remain unaffected as well.

In addition, according to some embodiments of the present disclosure, the anisotropic heat conducting zone 310 having a greater coefficient of planar heat conduction ($k_{x-y}$) is placed over the electronic component 21 with a greater heating power, and the anisotropic heat conducting zone 330 having a lower coefficient of planar heat conduction ($k_{x-y}$) is placed over the electronic component 22 with a lower heating power. The anisotropic heat conducting zone 330 having the lower coefficient of planar heat conduction ($k_{x-y}$) may have a less complex structure and/or adopt less costly materials, and thus the costs of manufacturing the semiconductor device package 2A can be reduced while still provided with a satisfactory heat dissipation effect.

Figure 2B:
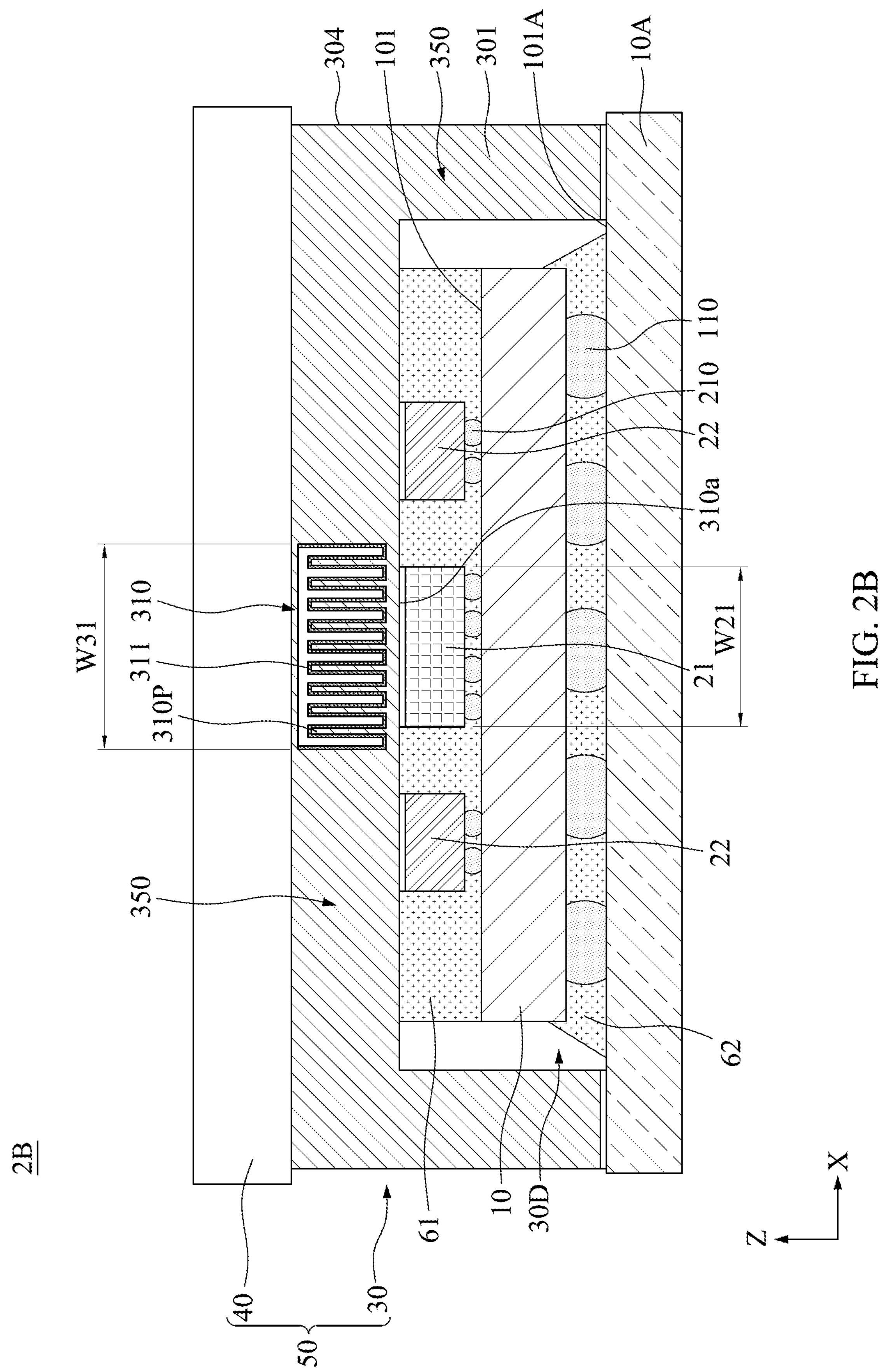
FIG. 2B is a cross-section of a semiconductor device package in accordance with some embodiments of the present disclosure.

FIG. 2B is a cross-section of a semiconductor device package 2B in accordance with some embodiments of the present disclosure. The semiconductor device package 2B is similar to the semiconductor device package 1 in FIG. 1, with differences therebetween as follows.

In some embodiments, the semiconductor device package 2B further includes an encapsulant 61 and an underfill 62. In some embodiments, the encapsulant 61 encapsulates the electronic component 21 (or the heat source) and the electronic component 22. In some embodiments, the electronic component 21 has an upper surface exposed by the encapsulant 61 and contacting the outer wall 310*a* of the heat dissipation element 30. In some embodiments, the electronic component 22 has an upper surface exposed by the encapsulant 61 and contacting the outer wall 310*a* of the heat dissipation element 30. In some embodiments, the underfill 62 covers the connection elements 110 and a portion of the substrate 10. In some embodiments, the encapsulant 61 is attached to the heat dissipating portion (or the isotropic heat conducting zone 350) of the heat dissipation element 30, and the heat transmitting portion (or the anisotropic heat conducting zone 310) is configured to reduce an expansion of the encapsulant 61 caused by absorbing heat generated by the heat source (or the electronic component 21). In some embodiments, while the encapsulant 61 may be disposed adjacent to the heat source (or the electronic component 21), thus the encapsulant 61 may easily absorb heat from the heat source (or the electronic component 21) and then expand, the heat transmitting portion (or the anisotropic heat conducting zone 310) is configured to reduce the expansion of the encapsulant 61 caused by absorbing heat generated by the heat source (or the electronic component 21).

In some embodiments, the substrate 10 and the electronic components 21 and 22 are disposed in an accommodating space 30D defined by the heat dissipation structure 50 (or the heat dissipation element 30) and an upper surface 101A of the carrier 10A. In some embodiments, the isotropic heat conducting zone 350 of the heat dissipation structure 50 is further located on one or more lateral sides of the substrate 10. In some embodiments, the heat dissipation structure 50 (or the heat dissipation element 30) includes a wall structure 301 connected to the carrier 10A and on one or more lateral sides of the electronic components 21 and 22. In some embodiments, the wall structure 301 includes the isotropic heat conducting zone 350.

Figure 2C:
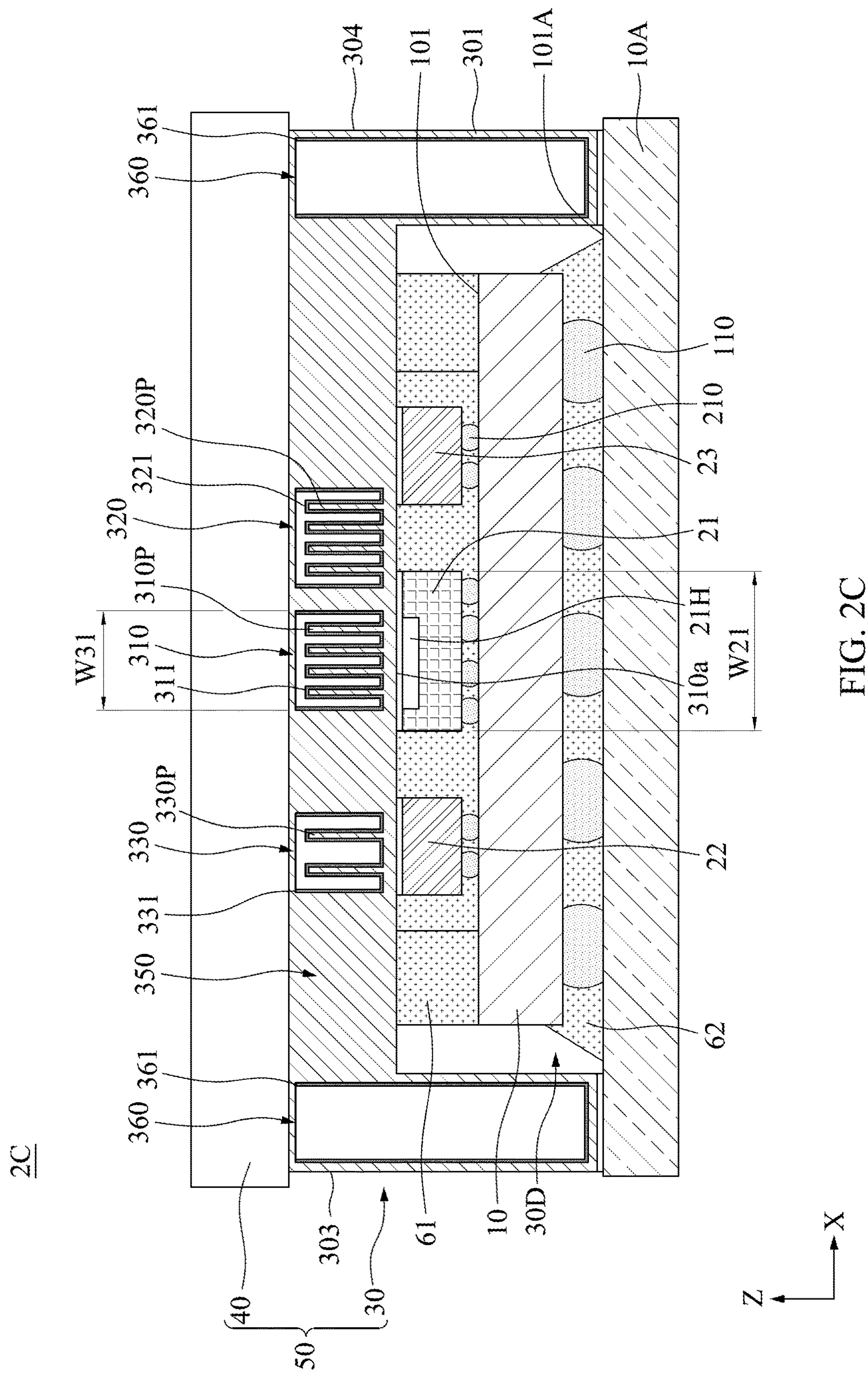
FIG. 2C is a cross-section of a semiconductor device package in accordance with some embodiments of the present disclosure.

FIG. 2C is a cross-section of a semiconductor device package 2C in accordance with some embodiments of the present disclosure. The semiconductor device package 2C is similar to the semiconductor device package 2A in FIG. 2A, with differences therebetween as follows.

In some embodiments, the semiconductor device package 2C further includes an encapsulant 61 and an underfill 62. In some embodiments, the encapsulant 61 encapsulates the electronic components 21, 22, and 23. In some embodiments, the heat source region 21H of the electronic component 21 has an upper surface exposed by the encapsulant 61 and contacting the outer wall 310*a* of the heat dissipation element 30. In some embodiments, upper surfaces of the electronic components 22 and 23 are exposed by the encapsulant 61 and contacting the outer wall 310*a* of the heat dissipation element 30. In some embodiments, the underfill 62 covers the connection elements 110 and a portion of the substrate 10.

In some embodiments, the heat dissipation structure 50 (or the heat dissipation element 30) includes a wall structure 301 connected to the carrier 10A and on one or more lateral sides of the electronic components 21, 22, and 23. In some embodiments, the wall structure 310 includes an anisotropic heat conducting zone 360. In some embodiments, the anisotropic heat conducting zone 360 has a greater coefficient of planar heat conduction ($k_{x-y}$) than that of the isotropic heat conducting zone 350, and configured to reduce heat conducting from the anisotropic heat conducting zone 360 toward the isotropic heat conducting zone 350. In some embodiments, the anisotropic heat conducting zone 360 may have a coefficient of planar heat conduction ($k_{x-y}$) equal to or less than that of the anisotropic heat conducting zones 310, 320, and 330.

In some embodiments, the anisotropic heat conducting zone 360 includes a vapor chamber and a wick structure 361 on an inner surface of the vapor chamber. In some embodiments, the wick structure 361 is on an inner sidewall and a bottom of the vapor chamber. In some embodiments, the anisotropic heat conducting zone 360 is a vapor chamber including a working liquid (or a working fluid) capable of entering a phase transition around a working temperature of elements and/or components in the carrier 10A. In some embodiments, the wick structure 361 includes a metal-containing material. The wick structure 361 may be composed of a copper-containing material configured to facilitate capillary phenomenon.

Figure 2D:
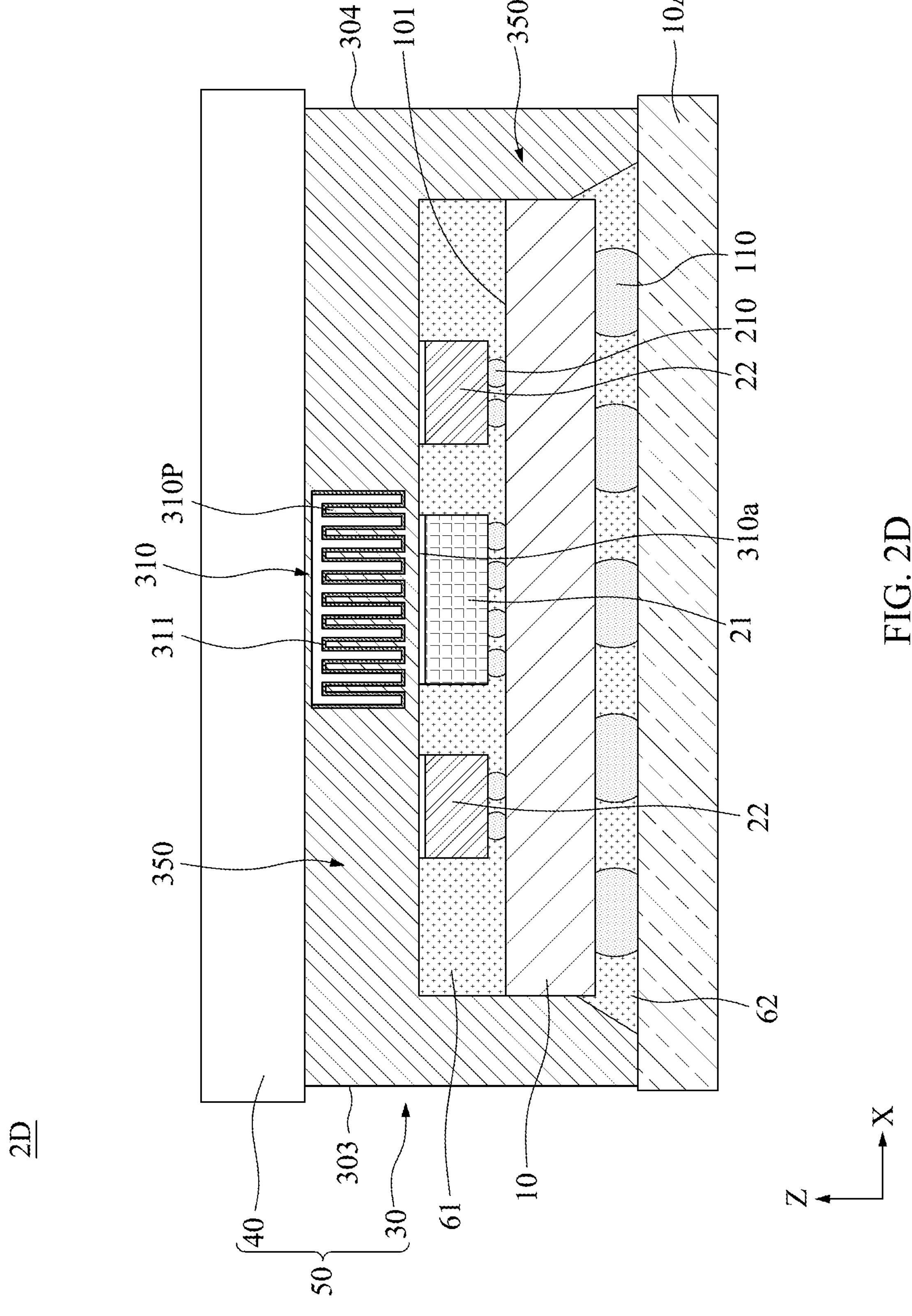
FIG. 2D is a cross-section of a semiconductor device package in accordance with some embodiments of the present disclosure.

FIG. 2D is a cross-section of a semiconductor device package 2D in accordance with some embodiments of the present disclosure. The semiconductor device package 2D is similar to the semiconductor device package 2B in FIG. 2B, with differences therebetween as follows. In some embodiments, the heat dissipation element 30 directly or physically contacts the substrate 10. In some embodiments, the heat dissipation element 30 directly or physically contacts the underfill 62. The heat dissipation element 30 may be or include a non-metal material which may be conformally formed on the substrate 10 and the underfill 62.

Figure 3A:
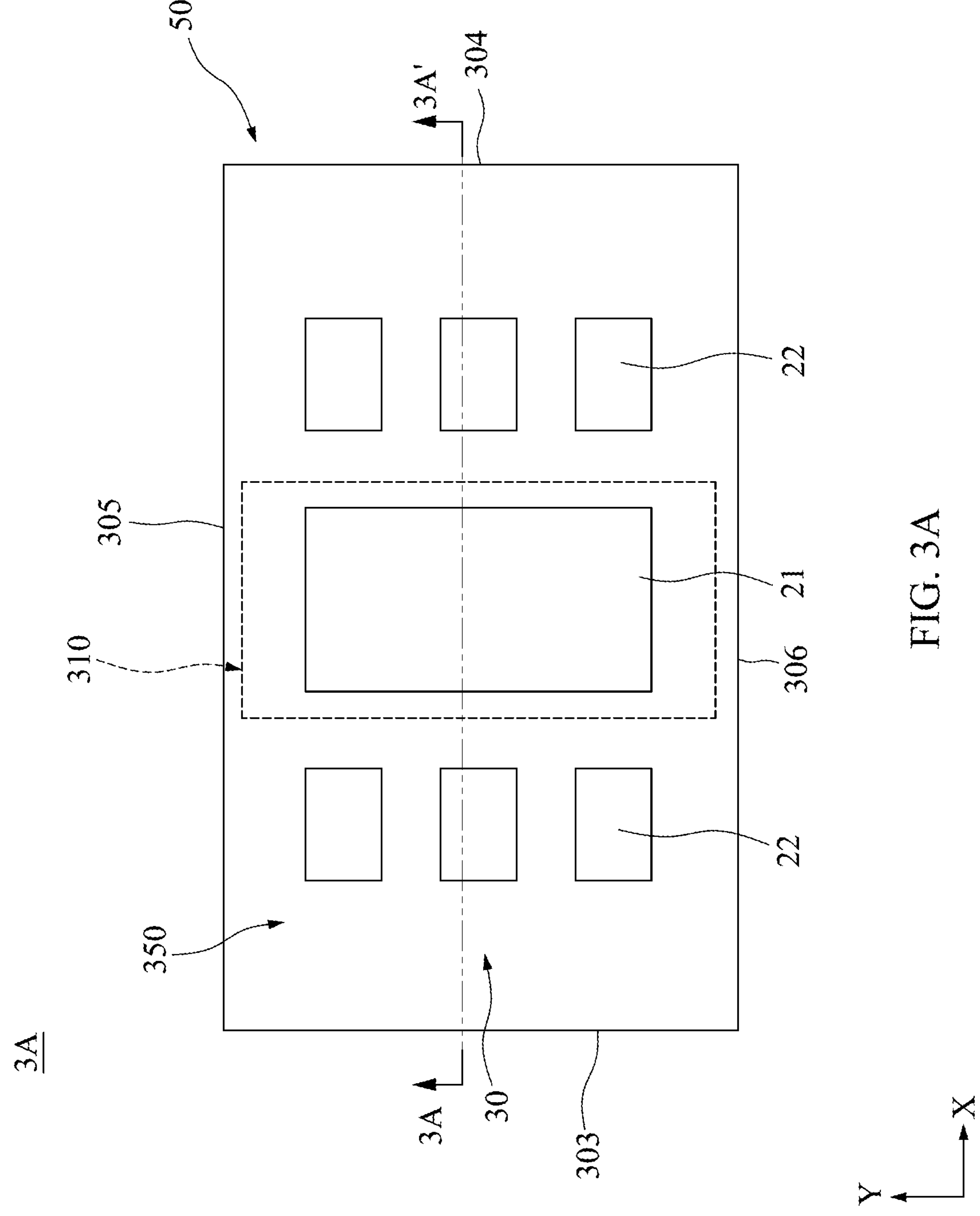
FIG. 3A is a top view of a semiconductor device package in accordance with some embodiments of the present disclosure.

FIG. 3A is a top view of a semiconductor device package 3A in accordance with some embodiments of the present disclosure. In some embodiments, FIG. 1, FIG. 2B, and FIG. 2D may each show a cross-sectional structure along a line 3A-3A' in FIG. 3A.

The heat dissipation structure 50 (or the heat dissipation element 30) may have edges 303, 304, 305, and 306 exposed to exterior environmental conditions. In some embodiments, the electronic component 21 is disposed closer to the edges 305 and 306 than to the edges 303 and 304. In some embodiments, a coverage of the anisotropic heat conducting zone 310 extends beyond the electronic component 20 and toward one or more edges (e.g., edges 305 and 306) of the heat dissipation structure 50 (or the heat dissipation element 30) from a top view perspective. In some embodiments, the heat transmitting structure (or the anisotropic heat conducting zone 310) entirely covers the heat source (or the electronic component 21) from a top view perspective. In some embodiments, an edge of the heat transmitting structure (or the anisotropic heat conducting zone 310) is closer to an edge (e.g., edges 305 and 306) of the heat dissipation element 30 than the electronic component 22 is from a top view perspective.

Figures 3B, 3C, 3D:
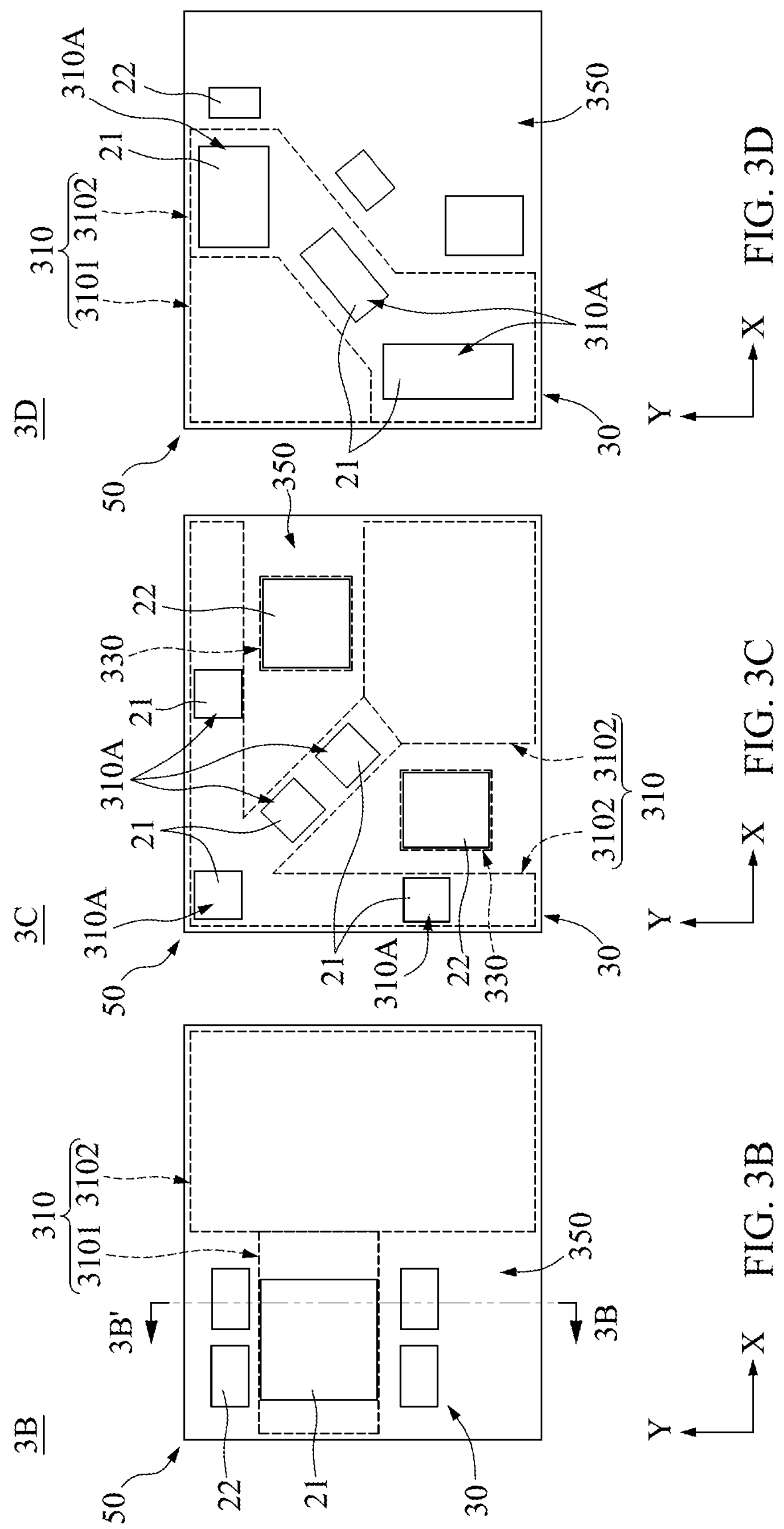
FIG. 3B is a top view of a semiconductor device package in accordance with some embodiments of the present disclosure.
FIG. 3C is a top view of a semiconductor device package in accordance with some embodiments of the present disclosure.
FIG. 3D is a top view of a semiconductor device package in accordance with some embodiments of the present disclosure.

According to some embodiments of the present disclosure, the vapor chamber of the anisotropic heat conducting zone 310 is adjacent to the edge of the heat dissipation structure 50 which is exposed to exterior environmental conditions having a relatively low temperature compared to that of the vapor chamber. Therefore, it is advantageous to conducting heat from the anisotropic heat conducting zone 310 toward outside of the semiconductor device package 3A. FIG. 3B is a top view of a semiconductor device package 3B in accordance with some embodiments of the present disclosure. In some embodiments, FIG. 1, FIG. 2B, and FIG. 2D may each show a cross-sectional structure along a line 3B-3B' in FIG. 3B. In some embodiments, the semiconductor device package 3D is similar to the semiconductor device package 3A in FIG. 3A, with differences therebetween as follows.

In some embodiments, the heat dissipation structure 50 (or the heat dissipation element 30) includes an anisotropic heat conducting zone 310 having a portion 3101 at least partially over the electronic component 21 and a portion 3102 over a region free of the electronic components 21 and 22. In some embodiments, the isotropic heat conducting zone 350 is connected to the anisotropic heat conducting zone 310. In some embodiments, the anisotropic heat conducting zone 310 has a greater coefficient of planar heat conduction ($k_{x-y}$) than that of the isotropic heat conducting zone 350, and configured to reduce heat conducting from the anisotropic heat conducting zone 310 toward the isotropic heat conducting zone 350.

In some embodiments, the portion 3101 of the anisotropic heat conducting zone 310 includes a first vapor chamber, and the portion 3102 of the anisotropic heat conducting zone 310 includes a second vapor chamber connected to the first vapor chamber of the portion 3101. In some embodiments, the coefficient of planar heat conduction ($k_{x-y}$) of the portion 3101 of the anisotropic heat conducting zone 310 is different from the coefficient of planar heat conduction ($k_{x-y}$) of the portion 3102 of the anisotropic heat conducting zone 310. In some embodiments, the portion 3102 of the anisotropic heat conducting zone 310 is arranged along the edge of the heat dissipation element 30 from a top view perspective.

According to some embodiments of the present disclosure, the anisotropic heat conducting zone 310 including not only the portion 3101 directly above the electronic component 21 but also the portion 3102 connected to the portion 3101 and free from overlapping the electronic components 21 and 22, the capacity of heat conduction of the anisotropic heat conducting zone 310 may be increased so as to increase the heat conduction speed with the predetermined direction and/or within the predetermined region. Therefore, the heat dissipation effects can be further improved while the heat-sensitive devices (e.g., the electronic component 22) can still be prevented from being damaged by heat.

FIG. 3C is a top view of a semiconductor device package 3C in accordance with some embodiments of the present disclosure. In some embodiments, the semiconductor device package 3C is similar to the semiconductor device package 3A in FIG. 3A, with differences therebetween as follows.

In some embodiments, the heat dissipation structure 50 (or the heat dissipation element 30) further includes an anisotropic heat conducting zone 330 over the electronic component 22. In some embodiments, the anisotropic heat conducting zone 330 includes a third vapor chamber disconnected from the first vapor chamber of the portion 3101 and the second vapor chamber of the portion 3102 of the anisotropic heat conducting zone 310. In some embodiments, a coefficient of planar heat conduction ($k_{x-y}$) of the anisotropic heat conducting zone 330 is different from the coefficient of planar heat conduction ($k_{x-y}$) of the portion 3101 or the portion 3102 of the anisotropic heat conducting zone 310. In some embodiments, the portion 3101 of the anisotropic heat conducting zone 310 is directly over the electronic components 21. In some embodiments, the portion 3102 of the anisotropic heat conducting zone 310 is between the isotropic heat conducting zone 350 and the portion 3101 of the anisotropic heat conducting zone 310.

In some embodiments, the heat transmitting structure (or the anisotropic heat conducting zone 310) extends between the electronic components 22 from a top view perspective. In some embodiments, the semiconductor device package 3C includes a plurality of the heat sources (or the electronic components 21), the heat transmitting structures (or the anisotropic heat conducting zone 310) further includes a plurality of heat transmitting portions 310A, and each of the heat transmitting portions 310A covers a corresponding one of the heat sources (or the electronic components 21) from a top view perspective. In some embodiments, the heat transmitting portions 310A are thermally connected.

FIG. 3D is a top view of a semiconductor device package 3D in accordance with some embodiments of the present disclosure. In some embodiments, the semiconductor device package 3D is similar to the semiconductor device package 3A in FIG. 3A, with differences therebetween as follows.

In some embodiments, the isotropic heat conducting zone 350 is directly over the electronic components 22. In some embodiments, the portion 3101 of the anisotropic heat conducting zone 310 is between the isotropic heat conducting zone 350 and the portion 3102 of the anisotropic heat conducting zone 310.

Figure 3E:
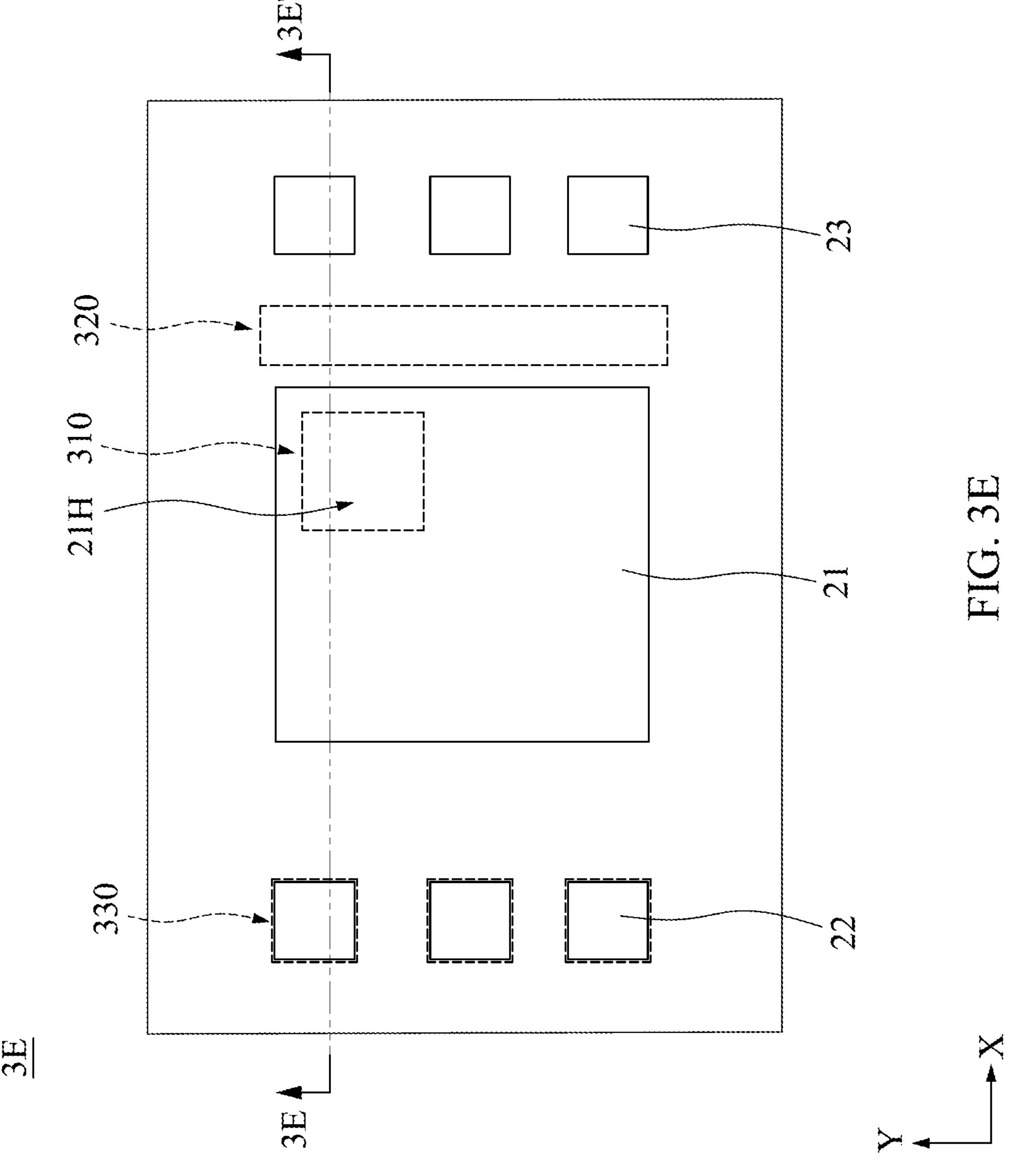
FIG. 3E is a top view of a semiconductor device package in accordance with some embodiments of the present disclosure.

FIG. 3E is a top view of a semiconductor device package 3E in accordance with some embodiments of the present disclosure. In some embodiments, FIG. 2A and FIG. 2C may each show a cross-sectional structure along a line 3E-3E' in FIG. 3E. In some embodiments, the semiconductor device package 3E is similar to the semiconductor device package 3A in FIG. 3A, with differences therebetween as follows.

In some embodiments, the anisotropic heat conducting zone 310 is directly above the heat source region 21H of the electronic component 21. In some embodiments, the anisotropic heat conducting zone 320 is between the electronic component 21 and the electronic components 23. In some embodiments, the anisotropic heat conducting zone 320 extends along an edge of the electronic component 21. In some embodiments, the anisotropic heat conducting zone 320 is free from overlapping the electronic components 23 from a top view perspective. In some embodiments, each of the anisotropic heat conducting zones 330 is partially or entirely over each of the electronic components 22 from a top view perspective.

FIG. 4A, FIG. 4B, FIG. 4C, and FIG. 4D illustrate various operations in a method of manufacturing a semiconductor device package in accordance with some embodiments of the present disclosure.

Figures 4A, 4B:
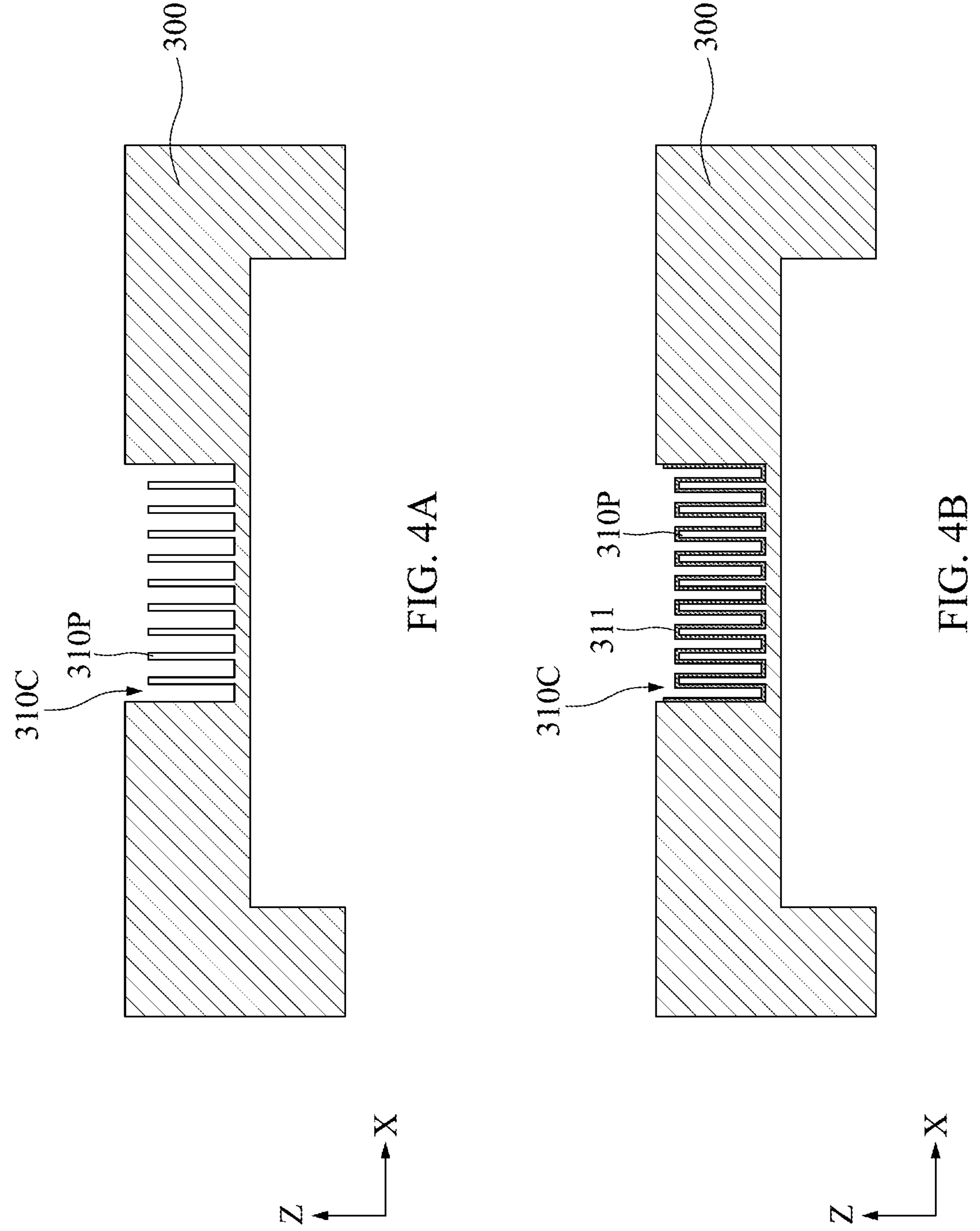
FIG. 4A, FIG. 4B, FIG. 4C, and FIG. 4D illustrate various operations in a method of manufacturing a semiconductor device package in accordance with some embodiments of the present disclosure.

Referring to FIG. 4A, a heat conducting body 300 may be provided, and a chamber 310C (or a recess) may be formed within the heat conducting body 300. In some embodiments, the chamber 310C may be formed by etching. In some embodiments, a plurality of protrusions 310P may be formed within the chamber 310C. In some embodiments, the protrusions 310P may be formed by etching the heat conducting body 300. In some embodiments, the chamber 310C and the protrusions 310P may be formed by a same etching operation performed on the heat conducting body 300. The heat conducting body 300 may include a metal-containing material, e.g., copper.

Referring to FIG. 4B, a wick structure 311 may be formed on an inner surface of the chamber 310C. The wick structure 311 may be conformally formed on surfaces of the protrusions 310P. In some embodiments, the wick structure 311 is formed on an inner sidewall and a bottom of the chamber 310C. In some embodiments, the wick structure 311 is formed on sidewalls of the protrusions 310P. In some embodiments, the wick structure 311 is formed by electroplating or other suitable deposition technique. In some embodiments, the wick structure 311 includes a metal-containing material, e.g., copper.

Figures 4C, 4D:
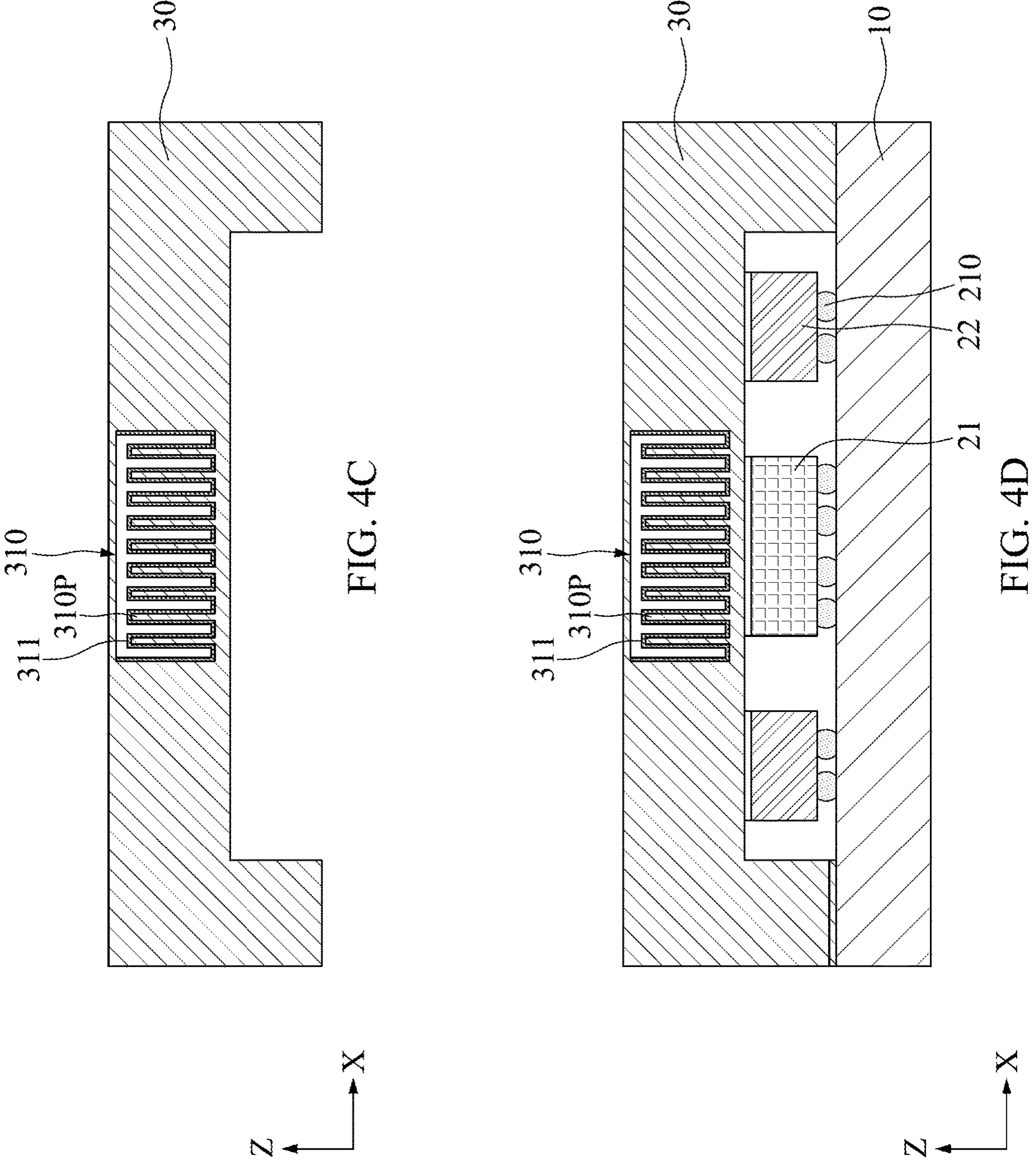

Referring to FIG. 4C, a cover may be formed on the heat conducting body 300 to seal the chamber 310C. The cover may include a metal-containing material, e.g., copper. In some embodiments, the cover may be sealed to the heat conducting body 300 through sintering the edge of the cover to the heat conducting body 300. In some embodiments, a working liquid (or a working fluid) capable of entering a phase transition around a predetermined temperature is disposed in the chamber 310C before it is sealed. As such, an anisotropic heat conducting zone 310 of a heat dissipation element 30 is formed.

Referring to FIG. 4D, electronic components 21 and 22 may be formed on or over a substrate 10, and the heat dissipation element 30 may be disposed on or over the electronic components 21 and 22 and the substrate 10. In some embodiments, the electronic components 21 and 22 are electrically connected to the substrate 10 through connection elements 210. In some embodiments, upper surfaces of the electronic components 21 and 22 directly or physically contact the heat dissipation element 30.

Next, referring to FIG. 1, the structure illustrated in FIG. 4D may be disposed on or over a carrier 10A, and a heat sink 40 may be disposed on the heat dissipation element 30 which collectively construct a heat dissipation structure 50. In some embodiments, the substrate 10 is electrically connected to the carrier 10A through connection elements 110. As such, the semiconductor device package 1 illustrated in FIG. 1 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package structure, comprising:
at least one electronic component;
a heat source adjacent to the electronic component; and
a heat dissipation element disposed adjacent to the heat source and the electronic component, the heat dissipation element comprising a heat transmitting structure configured to reduce heat which is from the heat source, through the heat dissipation element, and transmitting in a direction toward the electronic component, wherein the heat transmitting structure comprises:
a plurality of protrusions;
one or more dendritic structures disposed on surfaces of the plurality of protrusions, wherein the one or more dendritic structures comprise:
a plurality of trunks;
a plurality of first branches grown from the trunks; and
a plurality of second branches grown from the first branches, wherein the plurality of first branches and the plurality of second branches extend toward at least two different directions, wherein interfaces exist between the one or more dendritic structures and inner surfaces and bottom surfaces of the plurality of protrusions, and
wherein the heat transmitting structure is located over the heat source, and the heat transmitting structure is configured to dissipate heat upwards faster than in lateral directions.

2. The semiconductor package structure as claimed in claim 1, wherein the heat transmitting structure is an anisotropic heat conducting zone surrounded by an isotropic heat conducting zone of the heat dissipation element, wherein the anisotropic heat conducting zone has a coefficient of planar heat conduction ($k_{x-y}$) around 10-15 times greater than that of the isotropic heat conducting zone.

3. The semiconductor package structure as claimed in claim 2, wherein the anisotropic heat conducting zone is configured to confine the heat transferred from the heat source within a region above the heat source.

4. The semiconductor package structure as claimed in claim 1, wherein the heat transmitting structure is surrounded by the at least one electronic component and not overlapped by the at least one electronic component from a top view perspective.

5. The semiconductor package structure as claimed in claim 2, wherein the coefficient of planar heat conduction ($k_{x-y}$) of the anisotropic heat conducting zone is about 4500-5500 W/mk, and the coefficient of planar heat conduction ($k_{x-y}$) of the isotropic heat conducting zone about 300-450 W/mk.

6. The semiconductor package structure as claimed in claim 1, wherein the heat transmitting structure comprises a chamber entirely overlapping the heat source from a top view perspective, wherein a plurality of inter-dendritic pores between or among two or more dendritic structures are in the chamber.

7. The semiconductor package structure as claimed in claim 6, wherein a plurality of intra-dendritic pores defined by the trunks and the first branches are in the chamber.

8. The semiconductor package structure as claimed in claim 7, wherein the inter-dendritic pores have a size greater than that of the intra-dendritic pores.

9. The semiconductor package structure as claimed in claim 7, wherein the intra-dendritic pores enhance capillary force within the one or more dendritic structures and the inter-dendritic pores provide fluid channels with a reduced flow resistance in the chamber.

10. The semiconductor package structure as claimed in claim 1, wherein the interfaces include a first interface extending in a first direction and a second interface extending in a second direction perpendicular to the first direction.

11. The semiconductor package structure as claimed in claim 10, wherein the first interface is not overlapped by the second interface along the first direction and the second direction.

12. The semiconductor package structure as claimed in claim 2, wherein a first top surface of the anisotropic heat conducting zone and a second top surface of the isotropic heat conducting zone are coplanar.

13. The semiconductor package structure as claimed in claim 12, further comprising a thermal interface material (TIM) layer in direct contact with the anisotropic heat conducting zone.

14. A semiconductor package structure, comprising:
a heat source;
a heat dissipation element attached to the heat source, wherein the heat dissipation element comprises a heat transmitting portion and a heat dissipating portion, and the heat transmitting portion is configured to reduce a first expansion of the heat dissipating portion caused by the heat dissipating portion absorbing heat generated by the heat source, wherein the heat transmitting portion comprises:
a plurality of protrusions;
one or more dendritic structures disposed on surfaces of the plurality of protrusions, wherein the one or more dendritic structures comprise:
a plurality of trunks;
a plurality of first branches grown from the trunks; and
a plurality of second branches grown from the first branches, wherein the plurality of first branches and the plurality of second branches extend toward at least two different directions, wherein interfaces exist between the one or more dendritic structures and inner surfaces and bottom surfaces of the plurality of protrusions; and
a heat sink disposed over the heat dissipation element,
wherein the heat transmitting portion is located over the heat source, and the heat transmitting portion is configured to dissipate heat in a direction from the heat source toward the heat sink.

15. The semiconductor package structure as claimed in claim 14, further comprising:
a thermal interface material (TIM) layer between the heat source and the heat transmitting portion, wherein the TIM layer is in direct contact with the heat transmitting portion.

16. The semiconductor package structure as claimed in claim 14, further comprising:
at least one electronic component disposed adjacent to the heat source, wherein the heat transmitting portion is located over the heat source, and the heat transmitting portion is an anisotropic heat conducting zone configured to conduct the heat upwards faster than in the direction toward the at least one electronic component, and wherein the anisotropic heat conducting zone is configured to confine the heat transferred from the heat source within a region above the heat source.

17. The semiconductor package structure as claimed in claim 14, wherein the heat transmitting portion comprises a chamber, wherein the chamber entirely overlaps the heat source from a top view perspective, wherein a plurality of inter-dendritic pores between or among two or more dendritic structures are in the chamber, wherein a plurality of intra-dendritic pores defined by the trunks and the first branches are in the chamber, and wherein the inter-dendritic pores have a size greater than that of the intra-dendritic pores.

18. The semiconductor package structure as claimed in claim 14, wherein the heat dissipating portion is composed of a continuous portion of the heat dissipation element and the heat transmitting portion extends from an upper surface of the heat dissipating portion to a lower surface of the heat dissipating portion, wherein a first top surface of the heat transmitting portion and a second top surface of the heat dissipating portion are coplanar.

19. The semiconductor package structure as claimed in claim 16, wherein the anisotropic heat conducting zone is surrounded by the at least one electronic component and not overlapped by the at least one electronic component from a top view perspective.

20. A semiconductor package structure, comprising:

a first electronic component;

a heat source adjacent to the first electronic component;

a heat dissipation element disposed over the first electronic component and the heat source, wherein the heat dissipation element comprises a heat transmitting structure over the heat source, and the heat transmitting structure is free from overlapping the first electronic component from a top view perspective, wherein the heat transmitting structure comprises:

a plurality of protrusions;

one or more dendritic structures disposed on surfaces of the plurality of protrusions, wherein the one or more dendritic structures comprise:

a plurality of trunks;

a plurality of first branches grown from the trunks; and a plurality of second branches grown from the first branches, wherein the plurality of first branches and the plurality of second branches extend toward at least two different directions, wherein interfaces exist between the one or more dendritic structures and inner surfaces and bottom surfaces of the plurality of protrusions; and a substrate, to which the heat source is attached, wherein the heat transmitting structure is located over the heat source, and the heat transmitting structure is configured to dissipate heat in a direction perpendicular to an upper surface of the substrate.

* * * * *